United States Patent
Lin et al.

(10) Patent No.: US 7,157,215 B2
(45) Date of Patent: Jan. 2, 2007

(54) PHOTORESIST WITH ADJUSTABLE POLARIZED LIGHT REACTION AND PHOTOLITHOGRAPHY PROCESS USING THE PHOTORESIST

(75) Inventors: Shun-Li Lin, Hsinchu (TW); Wei-Hua Hsu, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/892,751

(22) Filed: Jul. 15, 2004

(65) Prior Publication Data
US 2004/0265739 A1    Dec. 30, 2004

Related U.S. Application Data

(62) Division of application No. 10/017,805, filed on Oct. 30, 2001, now abandoned.

(30) Foreign Application Priority Data
Jul. 26, 2001    (TW) ................. 90118271 A

(51) Int. Cl.
*G03F 7/20*    (2006.01)
*G03F 7/00*    (2006.01)
*G03F 7/04*    (2006.01)

(52) U.S. Cl. ............... 430/394; 430/270.1; 430/311; 430/325

(58) Field of Classification Search ............. 430/270.1, 430/325, 394, 311
See application file for complete search history.

(56) References Cited

U.S. PATENT DOCUMENTS

| | | | |
|---|---|---|---|
| 5,399,460 A | * | 3/1995 | Aldrich et al. ............ 430/287.1 |
| 5,789,141 A | * | 8/1998 | Usujima ..................... 430/313 |
| 5,917,980 A | * | 6/1999 | Yoshimura et al. ......... 385/129 |
| 6,115,514 A | * | 9/2000 | Ando et al. ................... 385/11 |
| 6,277,539 B1 | * | 8/2001 | Bajikar et al. ............ 430/271.1 |

* cited by examiner

*Primary Examiner*—Amanda Walke
(74) *Attorney, Agent, or Firm*—J.C. Patents

(57) ABSTRACT

A photoresist with adjustable polarized light response and a photolithography process using the photoresist. The photoresist and the photolithography process are suitable for use in an exposure optical system with a high numerical aperture. The photoresist includes a photosensitive polymer that can absorb the exposure light source to generate an optical reaction. The photosensitive polymer can also be oriented along a direction of an electric field or a magnetic field. The response for the photosensitive upon a polarized light is determined by an angle between the predetermined direction and the polarized light. In addition, the photolithography process adjusts the orientation of the photosensitive polymer, so that the P-polarized light has a weaker response than that of the S-polarized light to compensate for the larger transmission coefficient of the P-polarized light with a high numerical aperture, so as to prevent the photoresist pattern deformation.

16 Claims, 2 Drawing Sheets

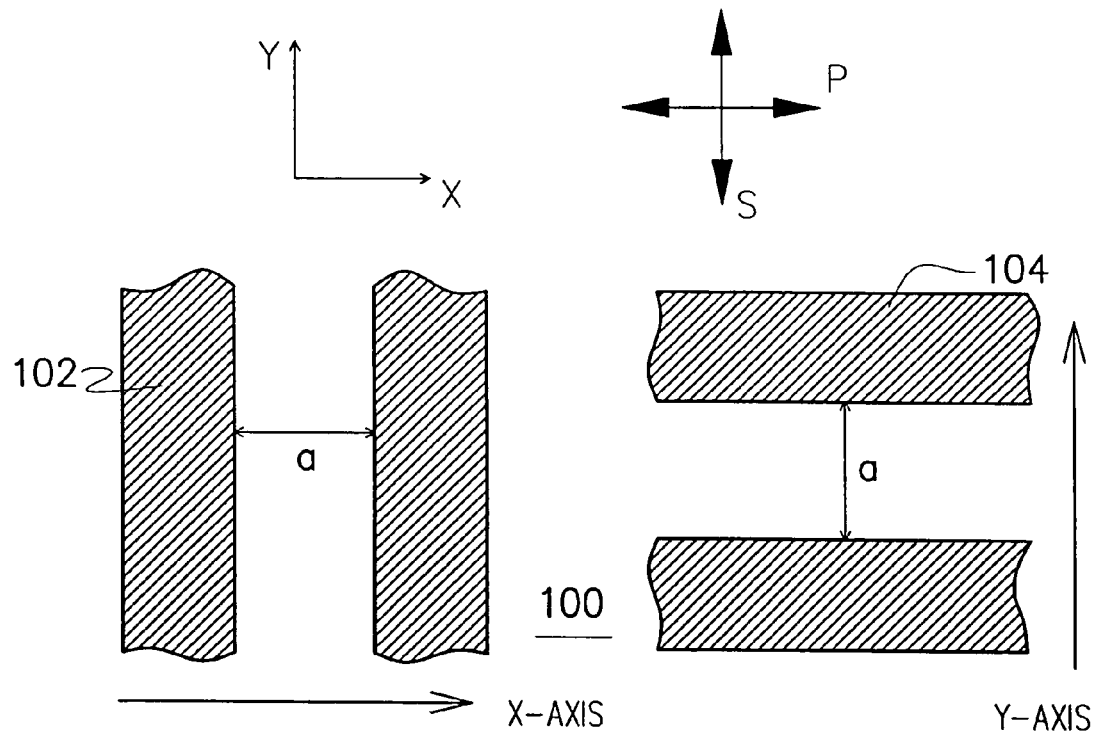
FIG. 1 (PRIOR ART)
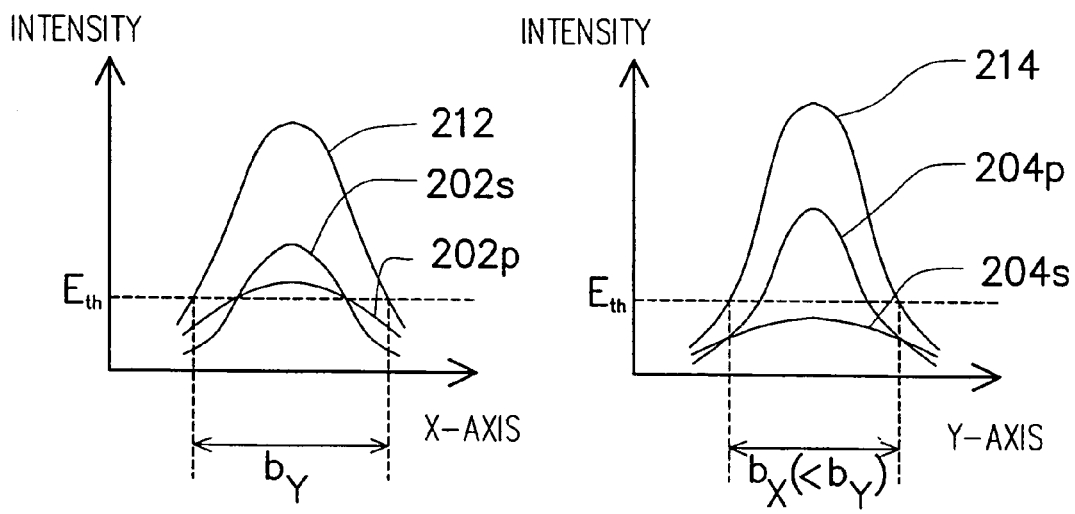
FIG. 2A (PRIOR ART)
FIG. 2B (PRIOR ART)

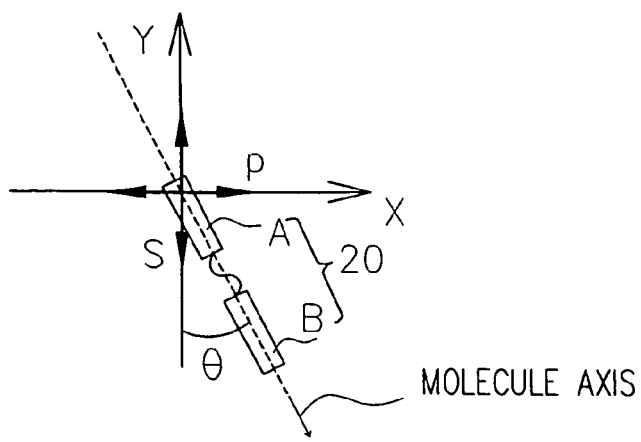
FIG. 3
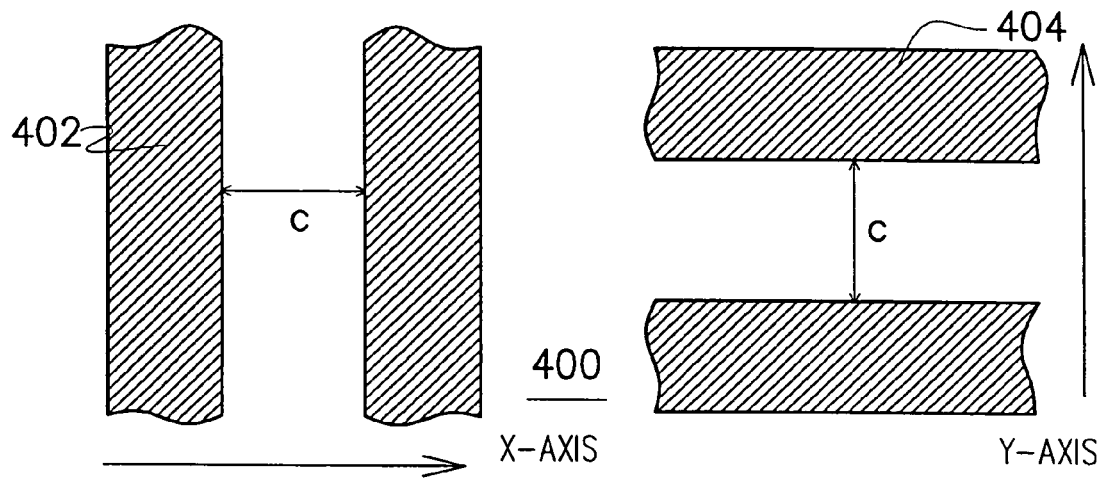
FIG. 4
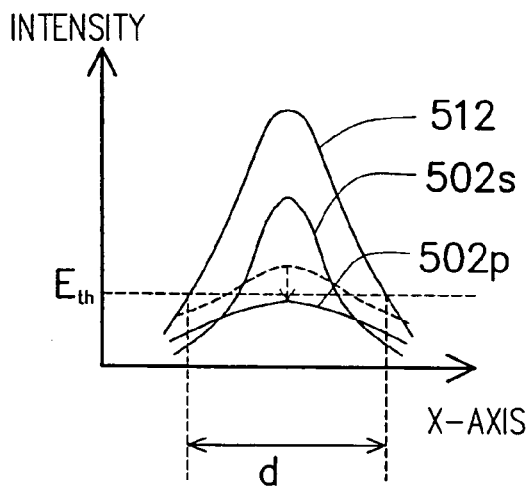 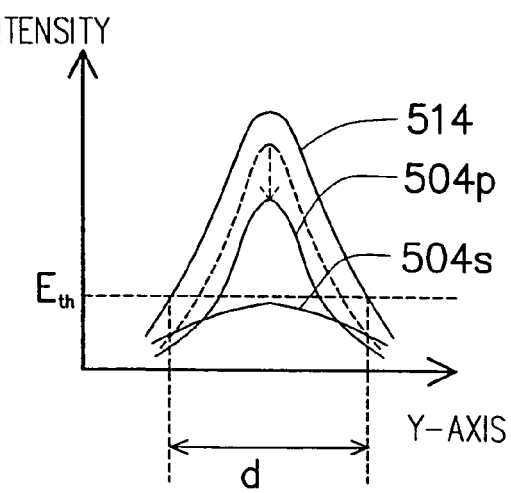
FIG. 5A         FIG. 5B

PHOTORESIST WITH ADJUSTABLE POLARIZED LIGHT REACTION AND PHOTOLITHOGRAPHY PROCESS USING THE PHOTORESIST

CROSS-REFERENCE TO RELATED APPLICATION

This application is a divisional application of, and claims the priority benefit of, U.S. application Ser. No. 10/017,805 filed on Oct. 30, 2001 now abandoned.

BACKGROUND OF THE INVENTION

1. Field of the Invention

The invention relates in general to a material used in a semiconductor fabrication process, and more particularly, to a photoresist with an adjustable polarized light response and a photolithography process using the photoresist.

2. Description of the Related Art

As the integration of semiconductor devices increases, the resolution of photolithography process becomes increasingly demanding. The analyzable minimum dimension (R) is defined as: $R=k_1 \lambda/NA$ ($\lambda$ is the wavelength, and NA is the numerical aperture of the optical system). From the above equation, it is known that the larger the numerical aperture is, the higher the resolution is. The numerical aperture of the exposure optical system used in the current photolithography process is thus gradually increased.

When the numerical aperture exceeds 0.7, pattern deformation is caused by the following reasons. First of all, the exposure light adopted for the exposure process is the polarized light. The polarized light includes the P-polarized and S-polarized lights perpendicular to each other in electromagnetic polarization direction. For a pattern with a certain orientation, P- and S-polarized lights cause different intensity profiles in a photoresist, and the total intensity that determines the photoresist pattern is the sum of the intensity profiles for both the P- and S-polarized lights.

When the numerical aperture is smaller than 0.7, the transmission coefficients for the P-polarized light and the S-polarized light are the same. Whatever the orientation of the pattern is, the total intensity profile and the photoresist pattern are not varied. However, when the numerical aperture is larger than 0.7, the transmission coefficient of the P-polarized light is larger than that of the S-polarized light, and the difference of transmission coefficient increases as the numerical aperture increases. Consequently, as the pattern orientation changes, the total intensity profile and the pattern profile are not consistent. An example of this phenomenon is given as follows.

FIGS. 1, 2A and 2B show the intensity profile and total intensity profile of a photoresist for a P-/S-polarized light traveling through a X-/Y-directional pattern and the pitch of a corresponding photoresist pattern (a positive photoresist is adopted). As shown in FIG. 1, the P-polarized light and the S-polarized light are polarized in the X- and Y-directions, respectively. The photomask 100 has a Y-directional pattern 102 and an X-direction pattern 104 with the same pitch (a).

As shown in FIG. 2A, the Y-directional pattern 102 is in the same direction as the polarization direction of the S-polarized light, so that the distribution of the intensity profile 202s of the S-polarized light 202s is narrower than distribution of the intensity profile 202p of the P-polarized light. On the other hand, as the transmission coefficient of the P-polarized light is larger than that of the S-polarized light, the integration of the intensity profile 202p is larger than that of the intensity profile 202s. That is, the total intensity profile 212 of the Y-directional pattern 102 is determined by the wider intensity profile 202p.

As shown in FIG. 2B, since the X-directional pattern is in the polarization direction of the P-polarized light, the distribution of intensity profile 204p of the P-polarized light is narrower than the distribution of the intensity profile 204s of the S-polarized light. In other words, since the transmission coefficient of the P-polarized light is larger than that of the S-polarized light, the integration of the intensity profile 204p is thus larger than that of the intensity profile 204s. Simply speaking, the total intensity profile 214 is determined by the intensity profile 204p with a narrower distribution.

Referring to FIGS. 2A and 2B, the total intensity profile 212 of the Y-directional pattern 102 is determined by the wider intensity profile 202p, and the total intensity profile 214 of the X-directional pattern 104 is determined by the narrower intensity profile 204p. Therefore, the total intensity profile 212 is larger than the total intensity profile 214. As a result, when a positive photoresist is used, under a certain threshold exposure intensity $E_{th}$, the photoresist pattern pitch $b_X$ of the X-directional pattern 104 is smaller than the photoresist pattern pitch $b_Y$ of the Y-directional pattern 102.

To resolve the above deviation, an optical system with a high numerical aperture is used to correct before performing the photolithography process. However, the current optical proximity correction model is designed to calculate the scalar of the incident only. The vector of the incident light (P/S polarized light) is not considered. Therefore, the difference in intensity profile caused by difference of transmission coefficient for P-/S-polarized light and pattern orientation cannot be compensated. The pitch and size of the resultant pattern is varied by the orientation change, so that deviation of different ratios occurs.

SUMMARY OF THE INVENTION

The invention provides a photoresist with an adjustable polarized light response. The photoresist is suitable for use in a photolithography process with a high numerical aperture. The photoresist includes a photosensitive polymer, for example, a linear photosensitive polymer, which absorbs an exposure light source to generate an optical reaction. The photosensitive polymer can be oriented to a certain direction using a physical method, for example, by applying an electric or magnetic field. The response of the photosensitive polymer to a polarized light is changed when an angle between the certain direction and the polarization direction of the polarized light changes.

The invention provides a photolithography process that uses the photoresist with an adjustable polarized light response. An exposure light source including a P-polarized light and an S-polarized light perpendicular to the P-polarized light is provided. The P-polarized light has a transmission coefficient larger than that of the S-polarized light. The above photoresist layer is formed on a substrate by spin coating or vapor deposition, for example. A photosensitive polymer of the photoresist layer is arranged with a predetermined direction using a physical method. The response of the P-polarized light is lower than that of the S-polarized light for the photosensitive polymer. As a result, the light response of the S-polarized light is larger than the P-polarized light, so that the larger transmission coefficient can be compensated. The photoresist layer is then exposed and developed.

As mentioned above, the photoresist with an adjustable polarized light response includes a photosensitive polymer of which the light response is variable with orientation. By adjusting the response of the P- and S-polarized lights, the difference in transmission coefficient can be compensated. Thus, the total intensity profile of the P- and S-polarized lights is not varied as the pattern orientation changes, and the pattern deformation can be prevented.

Both the foregoing general description and the following detailed description are exemplary and explanatory only and are not restrictive of the invention, as claimed.

BRIEF DESCRIPTION OF THE DRAWINGS

FIG. 1 shows the Y-directional pattern and X-directional pattern on a photomask, and the electric polarization direction of the P-/S-polarized lights, according to conventional methods;

FIGS. 2A and 2B show the intensity profile, the total intensity profile and the corresponding pattern pitch of a photoresist layer for a P-/S-polarized light penetrating through Y-/X-directional patterns, according to conventional methods, FIG. 3 shows the orientation of the linear photosensitive polymer of the invention and the electric polarization direction of the P-/S-polarized lights;

FIG. 4 shows the Y- and X-directional patterns and the electric polarization direction of P-/S-polarized light and according to the invention; and FIG. 5A and FIG. 5B show the effective intensity profile, the effective total intensity profile and the corresponding pattern pitch or size of a photoresist layer for a P-/S-polarized light penetrating through the Y-/X-directional patterns according to the invention.

DESCRIPTION OF THE PREFERRED EMBODIMENTS

FIG. 3 shows the orientation of the photosensitive polymer and polarization direction of the P-/S-polarized light. In this embodiment, a photosensitive polymer includes a linear photosensitive polymer 20 that may comprise an electric dipole or a magnetic dipole and may be oriented by applying an electric field or a magnetic field. The photosensitive polymer 20 further comprises a photosensitive section A and an anti-etching section B. The photosensitive section A absorbs the exposure light source to generate an optical reaction, and the anti-etching section B improves the force to resist the plasma etching. The photosensitive section A includes PMDA with a molecule weight $10^2 \sim 10^8$, and the anti-etching section B includes ODA with a molecule weight $10^2 \sim 10^8$, for example.

Referring to FIGS. 3, when the molecule axis (the dashed line) of the liner photosensitive polymer and the P(S)-polarized light overlap, the highest response of the P(S)-polarized light is obtained, while the lowest response of the S(P)-polarized light is obtained. Thus, when ratio of transmission coefficient of the S- and P-polarized lights is m:1 (m<1), the response ratio of the S-polarized light and the P-polarized light, 1:m, can be adjusted to 1:1 by adjusting the orientation closer to the electric polarization direction of the S-polarized light.

The method of adjusting the orientation the photosensitive polymer 20 includes applying an electric field or a magnetic field. When the photosensitive polymer 20 has electric dipoles, an electric field can be applied to adjust the orientation thereof. When the photosensitive polymer 20 has magnetic dipoles, a magnetic field can be applied to adjust the orientation thereof. The source of the electric field includes a plasma, a polarized ultra-violet light and a microwave. The source of the magnetic field includes a plasma.

Referring to FIG. 4 and FIGS. 5A and 5B, in an embodiment of a photolithography process, the effective total intensity profile of the X-directional pattern and the Y-directional pattern after adjusting the orientation of the linear photosensitive polymer is illustrated. The addition of "effective" before the "total intensity profile" is because the actual total intensity profile requires modification since responses of the P- and S-polarized lights are different. For the convenience of description, the response of the linear photosensitive polymer 20 to the S-polarized light is set as 1, and the response to the P-polarized light is set as m (m<1). The ratio of transmission coefficient of the S-polarized light to the P-polarized is thus m: 1. As the response to the P-polarized light is smaller than 1, the intensity profile of the P-polarized light is described as "effective" hereinafter.

As shown in FIG. 4, the photomask 400 comprises a Y-direction pattern 402 and an X-directional pattern 404. In FIG. 5A, the effective intensity profile of the Y-directional pattern 402 is the sum of the effective intensity profile 502p of the P-polarized light and the intensity profile 502s of the S-polarized light. The distribution of the effective intensity profile 502p is wider than that of the intensity profile 502s. Because the response of the linear photosensitive polymer 20 to the P-polarized light has been adjusted, the effective intensity profile 502p is lower than that of the actual intensity profile (illustrated as the dashed line). As a result, the integration of the effective intensity profile 502p is the same as the integration of the intensity profile 502s.

In FIG. 5, the effective total intensity profile 514 of the X-directional pattern is a sum of the effective intensity profile 504p of the P-polarized light and the intensity profile 504s of the S-polarized light. The distribution of the effective intensity profile 504p is narrower than that of the intensity profile 504s. Since the response of the linear photosensitive polymer 20 to the P-polarized light has been adjusted, the effective intensity profile 504p is lower than that of the intensity profile (dashed line). Consequently, the integration of the effective intensity profile 504p is the same as the integration of the intensity profile 504s.

Referring to FIGS. 5A and 5B, being proportionally reduced, the effective intensity profile 502p of the Y-directional pattern 402 is the same as the intensity profile 502s. Similarly, the effective intensity profile 504p of the X-directional pattern 404 is the same as the intensity profile 504s. After the summation, the effective intensity profile 512 of the Y-directional pattern 402 is the same as the effective intensity profile 514 of the X-directional pattern 404. Being developed, the photoresist pattern in the Y-direction has a pitch/size (for positive/negative photoresist) the same as that in the X-direction.

According to the above, the invention provides a photoresist comprising a photosensitive polymer of which the optical responses to the P-polarized and S-polarized lights can be adjusted, so that the difference in transmission coefficient can be compensated. The effective total intensity profile as a sum of the intensity profiles of the P- and S-polarized lights does not vary with the pattern orientation. The pitch and size of the photoresist pattern is thus consistent.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A photolithography process applying to a substrate, comprising:
   providing a photoresist layer that includes a photosensitive polymer, which absorbs an exposure light source to generate an optical reaction, and is oriented to a specific direction by a physical method, a specific direction being variable as an angle between the specific direction and a polarization direction of a polarized light changes;
   providing the exposure light source wit a first-polarized light and a second-polarized light perpendicular to each other, the first-polarized light having a transmission coefficient larger than tat of the second-polarized light;
   forming the photoresist layer on the substrate of which the specific direction of the photosensitive polymer has a response to the first-polarized light smaller tan a response to the S-polarized light to compensate for the difference of transmission coefficients, such that the optical reaction amount of the first-polarized light is about the same of the optical reaction amount;
   using the exposure light source and a photomask to expose the photoresist layer; and
   developing the photoresist layer.

2. The photolithography process according to claim 1, wherein the photosensitive polymer comprises a linear photosensitive polymer.

3. The photolithography process according to claim 2, wherein when a direction of the linear photosensitive polymer is parallel to the polarization direction of the polarized light, the linear photosensitive polymer has a maximum response to the polarized light, and when the direction of the liner photosensitive polymer is perpendicular to the polarization direction of the polarized light, the linear photosensitive polymer has a minimum response to the polarized light.

4. The photolithography process according to claim 2, wherein the linear photosensitive polymer comprises a photosensitive section and an anti-etching section.

5. The photolithography process according to claim 4, wherein the photosensitive section includes a PMDA.

6. The photolithography process according to claim 4, wherein the photosensitive section has a molecule weight of $10^2 \sim 10^8$.

7. The photolithography process according to claim 4, wherein the anti-etching section includes ODA.

8. The photolithography process according to claim 4, wherein the photosensitive section has a molecule weight of $10^2 \sim 10^8$.

9. The photolithography process according to claim 1, wherein the physical method includes applying an electric field when the photosensitive polymer has electric dipoles.

10. The photolithography process according to claim 9, wherein applying the electric field includes using a plasma.

11. The photolithography process according to claim 9, wherein applying the electric field includes using a polarized ultra-violet light.

12. The photolithography process according to claim 9, wherein applying the electric field includes using a microwave.

13. The photolithography process according to claim 1, wherein the physical method includes applying a magnetic field when the photosensitive polymer has magnetic dipoles.

14. The photo lithography process according to claim 13, wherein applying the magnetic field includes using a plasma.

15. The photolithography process according to claim 1, wherein forming the photoresist layer on the substrate includes a step of spin coating.

16. The photolithography process according to claim 1, wherein forming the photoresist layer on the substrate includes vapor deposition.

* * * * *